US006825303B2

(12) United States Patent
Lee

(10) Patent No.: US 6,825,303 B2
(45) Date of Patent: Nov. 30, 2004

(54) INTEGRATION OF LOW ε THIN FILMS AND TA INTO CU DUAL DAMASCENE

(75) Inventor: Chung J. Lee, Fremont, CA (US)

(73) Assignee: Dielectric Systems, Inc., Fremont, CA (US)

(*) Notice: Subject to any disclaimer, the term of this patent is extended or adjusted under 35 U.S.C. 154(b) by 245 days.

(21) Appl. No.: 09/795,217

(22) Filed: Feb. 26, 2001

(65) Prior Publication Data

US 2002/0120083 A1 Aug. 29, 2002

(51) Int. Cl.$^7$ ............................................... C08F 12/20
(52) U.S. Cl. ..................... 526/242; 526/348.1; 526/346; 528/244; 528/401
(58) Field of Search ............................... 526/242, 348.1, 526/346; 528/244, 401

(56) References Cited

U.S. PATENT DOCUMENTS

| | | |
|---|---|---|
| 3,268,599 A | 8/1966 | Chow |
| 3,274,267 A | 9/1966 | Chow |
| 3,280,202 A | 10/1966 | Gilch |
| 3,288,728 A | 11/1966 | Gorham |
| 3,332,891 A | 7/1967 | Chow et al. |
| 3,342,754 A * | 9/1967 | Gorham .......................... 260/2 |
| 3,349,045 A | 10/1967 | Gilch |
| 3,379,803 A | 4/1968 | Tittmann et al. |
| 3,503,903 A | 3/1970 | Shaw et al. |
| 3,509,075 A | 4/1970 | Niegish et al. |
| 3,626,032 A | 12/1971 | Norris |
| 3,694,495 A | 9/1972 | Norris |
| 3,940,530 A | 2/1976 | Loeb et al. |
| 5,268,202 A | 12/1993 | You et al. |
| 5,531,857 A | 7/1996 | Engelsberg |
| 5,538,758 A | 7/1996 | Beach et al. |
| 5,669,979 A | 9/1997 | Elliott |
| 5,879,808 A | 3/1999 | Wary et al. |
| 5,928,791 A | 7/1999 | Rosenmayer |
| 5,958,510 A | 9/1999 | Sivaramakrishnam |
| 5,965,679 A | 10/1999 | Godschalx |
| 6,015,918 A | 1/2000 | Zhuang |
| 6,020,458 A | 2/2000 | Lee |
| 6,033,939 A | 3/2000 | Agarwala |
| 6,130,171 A | 10/2000 | Gomi |
| 6,140,456 A * | 10/2000 | Lee et al. ................... 528/196 |
| 6,265,320 B1 | 7/2001 | Shi et al. |

FOREIGN PATENT DOCUMENTS

| | | |
|---|---|---|
| EP | 0 349 032 A2 | 1/1990 |
| EP | 0 523 479 A2 | 1/1993 |
| EP | 0 856 503 A1 | 8/1998 |
| GB | 650 947 | 3/1951 |
| GB | 673 651 | 6/1952 |
| WO | WO 97/15699 | 5/1997 |
| WO | WO-97/15951 | 5/1997 |
| WO | WO 97/42356 | 11/1997 |
| WO | WO-99/21705 | 5/1999 |
| WO | WO-99/21706 | 5/1999 |
| WO | WO-99/21924 | 5/1999 |

OTHER PUBLICATIONS

Brun A.E. 100NM: The Undiscovered Country, Semiconductor International, P79, Feb. 2000.

Chow, S. W., et al., "The synthesis of 1,1,2,2,9,9,10,10–octafluorou2, 2Paracyclophane" Journal of Organic Chemistry, American Chemical Society. Easton, US vol. 35(1), 1970 pp. 20–22.

Chow, S. W., et al., "Poly (a,a,a',a'–tetrafluoro–p–xylylene)," Journal of Applied Polymer Science, New York, NY<US, vol. 13, No. 9, 1969, pp. 2325–2332.

Yang, G.–R. et al., "High Deposition Rate Parylene Films," Journal of Crystal Growth, North–Holland Publishing Co., Amsterdam, NL, vol. 183, No. 3, 1998, pp. 385–390.

Greiner, A, "Poly(1,4–xylylene)s: Polymer Films by Chemical Vapour Deposition," Trends in Polymer Science, Elsevier Science Publishers B. V. Amsterdam, NL, vol. 5, No. 1, 1997, pp. 12–16.

Harrus, A. S., et al., "Parylene Af–4: A Low $e_R$ Material Candidate for ULSI Multilevel Interconnect Applications," Material Research Society Symposium Proceedings, vol. 443, 1997.

Iwamoto, R., et al., Crystal Structure of Poly–p–xylylene. I. The a Form, Jour. Polymer. Sci. Polymer. Phys. Ed., vol. 11, (1973), pp. 2403–2411.

Iwamoto, R., et al., "Crystallization During Polymerization of Poly–p–xylene. III. Crystal Structure and Molecular Orientation as a Function of Temperature," Jour. Polymer. Sci. Polymer. Phys. Ed., vol. 13, (1975), pp. 1925–1938.

Lang, C–I, "Vapor Deposition of Very low k Polymer Films, Poly (Naphthalene), Poly (Fluorinated Naphthalene)" Materials Research Society Symposium Proceedings, Materials Research Society, Pittsburgh, PA US, vol. 381, Apr. 17, 1995, pp. 45–50.

Lee C.J. "Polyimides, polyquinolines and polyquinoxalines: Tg–Structure Relationships" Macromol. Chem. Phys. C29(4) 431–560 (1989).

Lee, C, "Transport Polymerization of Gaseous Intermediates and Polymer Crystals Growth", *J. Macromol. Sci–Rev. Macromol. Chem.*, C16 (1), 79–127 (1977–78), PP79–127).

Mathur, D., et al., "Vapor Deposition of Parylene–F Using Hydrogen as Carrier Gas," Journal of Materials Research, vol. 14, No. 1, 1999, pp. 246–250.

(List continued on next page.)

Primary Examiner—Ling-Siu Choi
(74) Attorney, Agent, or Firm—Kolisch Hartwell, P.C.

(57) ABSTRACT

New precursors and processes to generate fluorinated poly (para-xylylenes) ("PPX") and their chemically modified films suitable for fabrications of integrated circuits ("ICs") of <0.15 μm are disclosed. The films so prepared have low dielectric constants ("ε") and are able to keep the integrity of the dielectric, Cu, and the barrier metal, such as Ta. Hence, the reliability of ICs can be assured.

16 Claims, 1 Drawing Sheet

OTHER PUBLICATIONS

Morgen, M., et al., "Morphological Transitions in Fluorinated and Non–Fluorinated Parylenes," Material Research Society Symposium Proceedings, vol. 565, 1999, pp. 297–302.

Peng Z., and McGivern, Sean., "Quantum Yields and Energy Partitioning in the UV Photodissociation of Halon 2402)", Jour. of Chem.Phys. vol. 113, No. 17, P7149–7157 (2000).

Plano, M. A., et al., "The Effect of Deposition Conditions on the Properties of Vapor–Deposited Parylene AF–4 Films," Material Research Society Symposium Proceedings, vol. 476, 1997, pp. 213–218.

Rashed, A.H., "Properties and characteristics of Silicon Carbide." a website publication (www.poco.com), POCO Graphite Inc. 300 old Greenwood Rd., Decatur, TX 76234.

Riedel, W., "Electro–less Nickel Plating $2^{nd}$ Edition", ASM International, Finishing Publication Ltd. 1998.

Ryan, E. T., et al., "Effect of Deposition and Annealing on the Thermomechanical Properties of Parylene Films," Material Research Society Symposium Proceedings, vol. 476, 1997, pp. 225–230.

Sharma, A. K., et al., "Optimizing Poly(chloro–p–Xylylene) or Parylene C Synthesis," Journal of Applied Science, John Wiley and Sons, Inc., New York, US, vol. 36, No. 7, Sep. 20, 1988, pp. 1555–1565.

Wary J, et al., Polymer Developed to be Interlayer Dielectric, Semi–Conductor International, 211–216, Jun. 1996.

International Search Report, Dated Mar. 12, 2002.

* cited by examiner

INTEGRATION OF LOW ∈ THIN FILMS AND TA INTO CU DUAL DAMASCENE

BACKGROUND

This invention relates to precursors and processes for the preparation of thin films which have a low dielectric constant ("∈"), which are stable at high temperatures, and which are used in the manufacture of semiconductor integrated circuits ("ICs"). In particular, this invention relates to new precursors and processes for obtaining a low ∈ (approximately 2.2) fluorinated poly (para-xlylenes) and related films that are compatible with a barrier metal, such as Ta. Ta is currently the most critically useful barrier material for fabrication of future ICs that use copper as a conductor (Ryu et al, *Solid State Technology*, April 1999, pp 53–56).

All commercially available poly(para-xylylenes), PPX (III), such as PPX-N (X=Z=H, n=0), PPX-C (X=H, Z=Cl, n=1), PPX-D (X=H, Z=Cl, n=2) and PPX-Nf (X=H, Z=F, n=4); Desu, et al. in "Low K Material IV," *Proceeding of MRS. Symposium*, Vol. 511(1998), MRS, pp 39–47)) are prepared by the Gorham method (Gorham et al. U.S. Pat. No. 3,342,754). The Gorham method employs a dimer precursor (I) that cracks under high temperatures ranging from 600 to 680° C. to generate the reactive, gaseous intermediate (II) under vacuum. When contacted with cold solid surfaces, the diradical (II) polymerizes according to reaction (2):

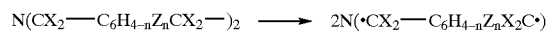

(I)  (II)

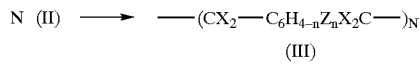

(III)

In equation (1), N is an integer denoting the number of molecules (I) and (II), and is at least 10, preferably at least 20, and more preferably at least 50. In equation (2), N is the average repeating unit of polymer PPX (III). It is an integer of at least 10, preferably at least 20, and more preferably at least 50. In both equations (1) and (2), n is zero, or an integer of 1 to 4.

The above commercially available PPX has dielectric constants (∈'s) ranging from about 2.5 to about 3.2, and is thermally unstable at temperatures of higher than 300 to 350° C. Thus, it is not very useful for future ICs that require low ∈ and good thermal stability.

PPX-F (III, X=F, Z=H, n=0, and N as defined above) has an ∈ value of 2.23 and is thermally stable up to 450° C. over 2.5 hours in a vacuum. Therefore, during the past few years, various attempts have been made to make PPX-F from the dimer (I, Z=H, n=0, X=F, N is as defined above) (Wary et al., *Proc. 2nd intl. DUMIC*, 1996 pp. 207–213; Wary et al., *Semiconductor Int'l*, 19(6), 1996, pp. 211–216) using commercially available equipment. However, these efforts were abandoned due to the high cost of the dimer and to the incompatibility of Ta with PPX-F films prepared by these methods (Lu et al., *J.Mater.Res*. Vol,14(1), 1999, pp. 246–250; Plano et al., *MRS Symp. Proc., Vol.* 476 (1998), pp. 213–218 and references herein).

Instead of using the Gorham method, Moore et al. (U.S. Pat. No. 5,268,202) employed a dibromo monomer (IV, Ar=$C_6H_4$, Y=Br) and metallic "catalysts" inside a reactor to generate reactive free radical (V) according to the reaction (3):

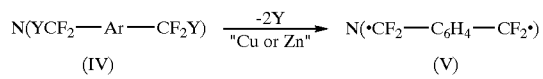

N in reaction (3) is the same as N in equation (1).

Further, to lower the cost of starting materials, Moore used a large proportion (>85 to 95 molar %) of a more readily available $CF_3$—$C_6H4$—$CF_3$ as the co-monomer to make PPX-F.

With regard to the use of monomer (IV, Ar=$C_6H_4$, Y=Br) in the above reaction (3), several points should be noted.

First of all, in U.S. Pat. No. 3,268,599, Chow discloses an example of the chemistry utilized to generate diradical (V). However, Chow only taught the method to prepare dimer (I, Z=H, X=F, n=0) by trapping (V) in a solvent. The equipment and processing methods Chow employed were not suitable for making the thin films that are useful for IC fabrication using Cu Dual Damascene process.

Secondly, according to Moore, without using the "catalysts," the above reaction (3) would need a cracking temperature ranging from 660–680° C. However, metallic "catalysts," such as Zn or Cu, would readily react with organic bromine at temperatures ranging from 300 to 450° C. which are the pyrolyzer temperatures employed by Moore. Formation of metallic halides on surfaces of these "catalysts" would quickly deactivate these "catalysts" and inhibit further debromination as shown in the reaction (3). In addition, the presence of Zn and Cu halides inside a pyrolyzer would cause contamination for the deposition system and dielectric films on wafer.

Thirdly, all commercial equipment used for cracking dimers consists of a Stainless Steel pyrolyzer. This pyrolyzer is not compatible with monomers that contain halogens, such as bromine or iodine (IV, Ar=$C_6H_4$, Y=Br or I), because the iron inside the pyrolyzer's surface would react with these halogens at temperatures higher than about 450 to 500° C.

Lastly, all fluorinated PPX-F films prepared from either monomers or dimers failed to pass a Ta-compatibility test so far. Specifically, when PPX-F was coated directly onto Ta or Ta was coated over PPX-F, film integrity of the Ta layer would fail after annealing these bilayer structures at temperatures ranging from 300 to 350° C. in vacuum or under inert atmosphere for 30 minutes.

In fact, so far there is no disclosure for methods and suitable equipment to make any low ∈ of lower or equal to 2.5 solid (not porous) dielectric films that can pass the Ta-compatibility test. The Ta-compatibility test is considered to be the most critical criterion for acceptance of any dielectric in future ICs that use Cu Dual Damascene process. This is because electroplated copper needs to be annealed at high temperatures ranging from 300 to 350° C., for 30 minutes to one hour, in order to achieve the desirable conductivity. A thermally stable conductive barrier such as Ta is sandwiched in between Cu and the dielectric to prevent diffusion of Cu into the dielectric during the annealing.

In addition, according to Wary et al, *DUMIC Proceeding*, Feb. 8–9, 1999, pp. 272–281, other fluorinated PPX-F, including perfluoro PPX, PF-PPX, (III, X=F, Z=F, n=4, and N is at least 20, and preferably at least 50), in principle, should have a lower $\in$ than that of PPX-F (III, X=F, Z=H, n=0, $\in$=2.23). PF-PPX is thermally more stable and has higher rigidity than PPX-F. However, starting dimers useful for making these polymers are very difficult to make. These dimers are only available in small quantities(few grams) and are very expensive. Thus, they are not economically feasible for manufacturing ICs.

Beach et al., in an International Patent Application (Number WO97/15541), claimed the preparation of PF-PPX. Beach et al. stated that PF-PPX can be prepared from its corresponding dimer, (—$CF_2$—$C_6F_4$—$CF_2$—)$_2$ and that "[t]he methods of producing the above described, (F) ring-substituted AF-4 dimer are not critical to the instant invention, as such methods could be implemented by those skilled in the art." This International Patent Application does not teach or demonstrate the methods to prepare the dimer (—$CF_2$—$C_6F_4$—$CF_2$—)$_2$, nor does the Application teach the making of PF-PPX.

In fact, for many years several attempts both at Los Alamos Lab, NM (Jorgensen et al., *JOWOG* Meeting-Org. Coating, Oct. 6–8, 1997) and at Marshallton Research Laboratory, King, N.C., have failed to make the desirable dimer(—$CF_2$—$C_6F_4$—$CF_2$—)$_2$ and monomer, $YCF_2$—$C_6F_4$—$CF_2Y$ (Y=Br or I). The difficulty in making the dimer is even greater because it will take more reaction steps to produce the dimer.

Lee et al. in U.S. Pat. No. 6,020,458 disclosed fluorinated chemical precursors and methods of manufacture of polymer thin films with low dielectric constants and integrated circuits comprised of $sp^2C$—F bonds and some hyperconjugated $sp^3C$—F bonds. The reference discloses precursors for creating fluorinated silanes and siloxanes and fluorinated hydrocarbon polymers.

Thus, the prior art contains no teaching for the methods and suitable equipment to make any low $\in \leq 2.5$ solid (not porous) dielectric films that can pass the Ta-compatibility test.

SUMMARY

The present invention is directed to overcoming the disadvantages of the prior art. Accordingly, one object of the invention is to provide precursors and methods that can be used to make fluorinated, especially perflourinated PPX films.

Another object of the invention is to provide low $\in$ ($\leq 2.2$), Ta-compatible films suitable for fabrications of ICs that use Cu Dual Damascene Process.

Yet, another object of the invention is to provide chemical processes that can be used to make Ta-compatible fluorinated PPX films.

Another object of the present invention is to provide material compositions and processing methods for making chemically modified fluorinated PPX films that are compatible with Ta.

Still, another object of the present invention is to provide materials and processes for making amorphous polymer films that are compatible with Ta.

Yet, another object of the present invention is to provide materials and processes for making a heterogeneous dielectric layer that is compatible with Cu Dual Damascene process.

Still another object of the present invention is to provide materials and processes for making a dielectric layer with preferred polymer chain orientations that are compatible with Cu Dual Damascene process.

Another object of the present invention is to provide materials and processes for ensuring the integrity of low k/Cu/Ta/low k layer structures after annealing the electroplated copper in ICs.

Other objects, aspects and advantages of the invention can be ascertained from the review of the additional detailed disclosure, the examples, the figures and the claims.

DETAILED DESCRIPTION OF THE PREFERRED EMBODIMENT

Figure 1:
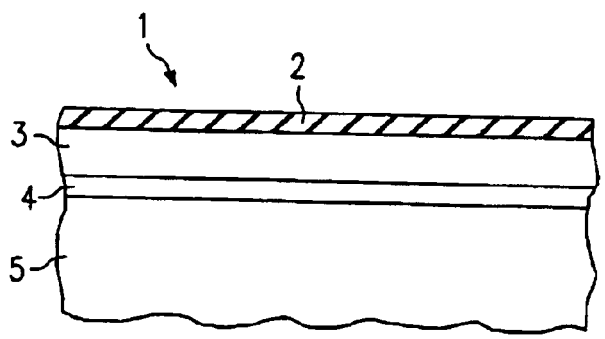
FIG. 1 shows a Ta test structure.

Broadly, one aspect of the present invention pertains to a polymer film prepared by co-polymerization of two reactive intermediates under vacuum or inert atmosphere. The two reactive intermediates are represented by (A) and (B), respectively. The reactive intermediate (A) is an aromatic compound, Ar, consisting of n' reactive sites with n' unpaired electrons. The number n' is an integer of at least 2 but smaller than, or equal to, the maximum number of sites for the $sp^2C$ substitution in reactive intermediate (A). The reactive intermediate (B) is a bridging compound consisting of n" reactive sites with n" reactive unpaired electrons. The number n" is an integer of at least 2 but smaller than, or equal to, the maximum number of sites for the $sp^3C$ substitution in reactive intermediate (B).

The vacuum is lower than about 30 mTorrs, preferably about 10 mTorrs. The deposition system should have an air or system leakage rate of less than about 2, preferably 0.4 mTorrs/minute.

An inert atmosphere is an atmosphere that is devoid of free radical scavengers such as water and oxygen or devoid of a compound containing an "active hydrogen," such as —OH, —SH, or —RNH group.

The reactive intermediate (A) can be generated, by a chemical process under vacuum or inert atmosphere, from a precursor having the following general chemical structure: $(X')_m$—Ar—$(X'')_n$, in which each of X' and X" is a leaving group, Ar is an aromatic compound connecting with n substitution-groups of X's and m substitution-groups of X"s. The numbers n and m can be independently 0 or an integer, and (n+m) is at least 2, but can equal to the total $sp^2C$ substitutions in the aromatic moiety, Ar.

The reactive intermediate (A) can also be generated, by a chemical process under vacuum or inert atmosphere, from a precursor having the following general chemical structure: $(X')_m$—Ar—$(CZ'Z''Y)_n$, in which each of X' and Y is a leaving group, Ar is an aromatic compound connecting with m substitution-groups of X's and n substitution-groups CZ'Z"Y's. Each of Z' and Z" is H, F or —$C_6F_5$, and preferably F for achieving a lower dielectric constant and higher thermal stability. The numbers n and m can be independently 0 or an integer, and (n+m) is at least 2 and can be equal to the total $sp^2C$ substitutions in the aromatic moiety, Ar.

In either method discussed above, each of X', X", and Y is a leaving group. A leaving group is a group that can be removed from a precursor by chemical methods, such as by irradiation using photons or electrons or by cracking using heat or plasma or by the combination of the above methods.

Examples of leaving groups include a ketene, —COOH, —Br, —I, —NR$_2$, —N$^+$R$_3$, —SR, —SO$_2$R, —OR, =N$^+$=N$^-$, —C(O)—N$_2$, (CF$_3$—CF(O))—, and others, in which R is an alkyl or aromatic group.

Examples of the aromatic moiety, Ar, include, but are not limited to, the phenyl moiety, —C$_6$H$_{4-n}$F$_n$(n=0 to 4) such as —C$_6$H$_4$— and —C$_6$F$_4$—; the naphthenyl moiety, —C$_{10}$H$_{6-n}$F$_n$— (n=0 to 6) such as —C$_{10}$H$_6$— and —C$_{10}$F$_6$—; the di-phenyl moiety, —C$_{12}$H$_{8-n}$F$_n$— (n=0 to 8) such as —C$_6$H$_2$F$_2$— and —C$_6$F$_4$—C$_6$H$_4$—; the anthracenyl moiety, —C$_{12}$H$_{8-n}$F$_n$— (n=0 to 8); the phenanthrenyl moiety, —C$_{14}$H$_{8-n}$F$_n$— (n=0 to 8); the pyrenyl moiety, —C$_{16}$H$_{8-n}$F$_n$— (n=0 to 8) and more complex combinations of the above moieties such as —C$_{16}$H$_{10-n}$F$_n$— (n=0 to 8). Isomers of various fluorine substitutions on the aromatic moieties are also included. Preferably, Ar is —C$_6$F$_4$—, C$_{10}$F$_6$—, of —C$_6$F$_4$—C$_6$F$_4$—. Examples of the reactive intermediate (A) include benzyne, such as .C$_6$H$_4$., fully- or partially-fluorinated benzyne, such as .C$_6$F$_4$., —.C$_6$H$_4$.CF$_2$—, and —.C$_6$F$_4$.CF$_2$—.

The intermediate (B) has the general chemical structure of .C.(Z'Z"), in which each of Z' and Z" are H, F, or —C$_6$F$_5$, preferably F for achieving lower dielectric constant and higher thermal stability. Examples of (B) include a divalent carbon having two free radicals, such as a carbene, a fully- or partially-fluorinated carbene. A carbene is a divalent carbon. It is virtually an isoelectronic isomer of its diradical, but it bears two unbound electrons on the same carbon. The carbene bridging compound can be generated by a chemical process from a precursor of the following general chemical structure: X-C(Z'Z"), wherein X is a leaving group, such as a ketene, —C(O)—N$_2$, and CF$_3$—CF(—O—)—; and wherein each of Z' and Z" is H, F, or —C$_6$F$_5$, preferably F for achieving lower dielectric constant and higher thermal stability.

The chemical processes under vacuum or inert atmosphere used in this invention include irradiation using photons or electrons or by cracking using heat or plasma or by the combination of the above methods. The photon source can be UV ranging from about 130 to about 480 nm, preferably from about 200 to about 245 nm. The heat source can be a resistive heater or an IR heater. The vacuum is lower than about 50 mTorrs, preferably about 30 mTorrs. The deposition system should have an air or system leakage rate of less than about 2, preferably 0.4 mTorrs/minute. An inert atmosphere is an atmosphere that is devoid from free radical scavengers such as water, oxygen, or a compound containing an active hydrogen such as —OH, —SH, or —NRH group.

Examples of the resultant polymers from co-polymerization of reactive intermediates (A) and (B) include: Fluorinated PPX, such as PPX-F (—CF$_2$C$_6$H$_4$CF$_2$—), perfluoro PPX (—CF$_2$C$_6$F$_4$CF$_2$—), fluoro PMP (—C$_6$H4CF$_2$—), perfluoro PMP (—C$_6$F$_4$CF$_2$—), and their copolymers. The resultant polymers can be amorphous or semicrystalline.

For any low ∈ dielectric material to be acceptable for integration into ICs, it has to pass at least several key criteria which include:

(1) The dielectric should be compositionally and dimensionally stable, and this structural integrity should be intact after it is integrated in ICs. This means that the dielectric integrity should remain after it is exposed to processes involved in fabrication of IC. These processes include reactive ion etching ("RIE") or plasma patterning, physical vapor deposition ("PVD") of Ta, electroplating and annealing of copper, and chemical mechanical polishing ("CMP") of copper etc. In addition, to maintain its electrical integrity after IC fabrication, the dielectric should be free from contamination by barrier materials such as Ta.

(2) The dielectric should not cause structural or chemical breakdown of a barrier metal such as Ta. This means that no corrosive organic element that would cause the interfacial corrosion of Ta and that no organic element should diffuse into the Ta layer. In addition, the dielectric should have sufficient dimensional stability so that interfacial stress resulting from Coefficient of Thermal Expansion ("CTE")-mismatch between the dielectric, and Ta would not induce structural failure of Ta during and after annealing of copper. In addition, the interfacial adhesion of the dielectric and Ta should be sufficient to overcome interfacial and shear stresses and warrant good adhesion after annealing and CMP of copper.

(3) The interfaces of the dielectric and Ta should be free from moisture thus no ionic migration would occur when ICs are operating under electrical bias.

1. Preparations of PPX-F and PF-PPX

In 1999, Gleason et al. (*MRS Spring Meeting Proceeding*, Sec. O6.6, 1999; ibid, U.S. Pat. No. 5,888,591) demonstrated a thermal process to make. CF$_2$. diradical, or difluorocarbene, and its corresponding polymer, (—CF$_2$—)$_N$, or Teflon, according to the following reactions:

$$N(CF_3-CF(-O-)-CF_2) \xrightarrow{-N(CF_3-CO-F)} N(\cdot CF_2 \cdot) \longrightarrow (-CF_2-)_N \quad (4)$$

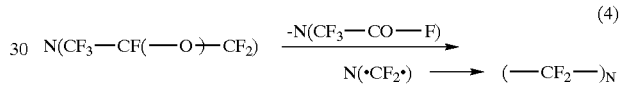

(VI); Hexafluoropropylene oxide where N is as defined above. Diradicals such as carbenes can be used for making linear polymers in vacuum or in absence of free radical scavengers such as oxygen. A carbene is a divalent carbon, and it is virtually an isoelectronic isomer of its diradical. However, it bears two unbound electrons on the same carbon. Other carbene, particularly difluorocarbene precursors, can also be used to practice this invention/where N is as defined above.

Diradicals such as carbenes can be used for making linear polymers in vacuum or in absence of free radical scavengers such as oxygen. A carbene is a divalent carbon and it is virtually an isoelectronic isomer of its diradical, but it bears two unbound electrons on the same carbon. Other carbene, particularly difluorocarbene precursors, can also be used to practice this invention.

However, Teflon's thermal stability is limited to about 300° C. for a short time (<<1 hours), and thus it is not stable during annealing of copper at 300° C./1 hour or 350° C./0.5 hour. In addition, its rigidity as reflected in its Young's Modulus is not sufficiently high for CMP of copper. Therefore, Teflon is not desirable for integration into future ICs that use Cu Dual Damascene process to manufacture.

To improve thermal stability and rigidity, a rigid aromatic moiety has to be incorporated into Teflon's backbone structure. This approach will make resulting films more desirable as a dielectric for fabrication of future ICs. For instance, it is known that PPX-F, —(CF$_2$—C$_6$H$_4$—CF$_2$)$_N$—, has a good thermal stability of up to 450° C. for two hours in vacuum or under an inert atmosphere and is sufficiently rigid for CMP process of copper.

Another type of diradicals called benzyne, such as .C$_6$H$_4$., can be reacted to form totally rigid aromatic polyphenylene, —(—$C_6H_4$—)$_N$, where N is the number of repeating unit for polyphenylene, and N is an integer of at least 10, and preferably at least 50. Precursors that can be used to generate benzynes have a general chemical structure as follows:

$$X—Ar—X \quad (VII)$$

Here, Ar is an aromatic moiety including, but not limiting to, the phenyl moiety, —$C_6H_{4-n}F_1$(n=0 to 4) such as —$C_6H_4$— and —$C_6F_4$—; the naphthenyl moiety, —$C_{10}H_{6-n}F_n$— (n=0 to 6) such as —$C_{10}H_6$— and —$C_{10}F_6$—; the di-phenyl moiety, —$C_{12}H_{8-n}F_n$— (n=0 to 8) such as —$C_6H_2F_2$—$C_6H_2F_2$— and —$C_6F_4$—$C_6H_4$—; the anthracenyl moiety, —$C_{12}H_{8-n}F_n$— (n=0 to 8); the phenanthrenyl moiety, —$C_{14}H_{8-n}F_n$— (n=0-8); the pyrenyl moiety, —$C_{16}H_{8-n}F_n$— (n=0-8) and more complex combinations of the above moieties such as —$C_{16}H_{10-n}F_n$— (n=0-10) Isomers of various fluorine substitutions on the aromatic moieties are also included.

X is a leaving group such as —COOH, —Br, —I, —$NR_2$, —$N^+R_3$, —SR, —$SO_2R$, or —OR. Herein, R is an alkyl or aromatic group.

Accordingly, copolymerization of N moles of .$C_6H_4$. with 2N moles of .$CF_2$. diradicals that generated respectively from commercially available monomers such as (VII, Ar=$C_6H_4$, X=COOH) and (VI), hexafluoropropylene oxide would result in one molecule of PPX-F with an average repeat unit of N, (—$CF_2$—$C_6H_4$—$CF_2$)$_N$, and N=should be at least about 20, and preferably about 50, to be useful for this invention. This new chemical process would provide PPX-F without needing an expensive monomer such as Y$CF_2$—$C_6H_4$—$CF_2$Y (Y=Br) or an even more expensive dimer (I) such as (—$CF_2$—$C_6H_4$—$CF_2$—)$_2$.

More importantly, co-polymerization of N moles of .$C_6F_4$. with 2N moles of .$CF_2$. diradicals that were generated respectively from commercially available monomers such as (VII, Ar=$C_6F_4$, X=COOH) and (VI) hexafluoropropylene oxide would result in one molecule of PF-PPX, with an average repeating unit of N, (—$CF_2$—$C_6F_4$—$CF_2$)$_N$, where N should be at least 20, and preferably 50, to be useful in this invention. The PF-PPX has lower ∈ (about 2.1 to 2.0). It is more thermally stable and more rigid than PPX-F. Thus, it is more desirable for fabrications of future ICs that use the Cu Dual Damascene Process. Most significantly, this newly invented chemical processes will provide PF-PPX without needing a still unavailable monomer, Y$CF_2$—$C_6F_4$—$CF_2$Y (Y=Br) or dimer (—$CF_2$—$C_6F_4$—$CF_2$—)$_2$.

In addition, the following precursors (VIII, Y=Br, or I; X=—COOH, —Cl, —Br, —I, and —$NR_2$, —$N^+R_3$, —SR., —$SO_2R$, or —OR, n=0 to 4, and N=at least 10, preferably at least 20, and more preferably at least 50) can also be used for the preparation of PPX-F (n=0) and PF-PPX (n=4), according to following reactions (5 & 6):

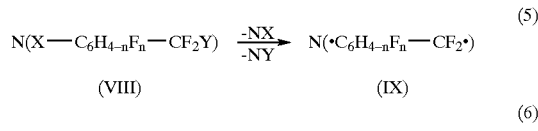

$$N(X—C_6H_{4-n}F_n—CF_2Y) \xrightarrow[-NY]{-NX} N(\cdot C_6H_{4-n}F_n—CF_2\cdot) \quad (5)$$

$$(VIII) \qquad\qquad (IX)$$

$$N(\cdot CF_2\cdot) + (IX) \longrightarrow (—CF_2—C_6H_{4-n}F_n—CF_2—)_N \quad (6)$$

Numerous novel linear copolymers consisting of various amounts of —Ar— and —$CF_2$— groups can also become available by varying the molar ratio of co-monomers such as VI and VII or VIII. For instance, the following copolymers can thus be prepared using the chemistry taught in this invention:

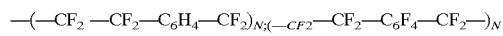

—(—$CF_2$—$CF_2$—$C_6H_4$—$CF_2$)$_{N}$:(—$_{CF2}$—$CF_2$—$C_6F_4$—$CF_2$—)$_N$

The above polymers, however, are still not available from other known preparation methods that are compatible with IC fabrication processes.

Using some of the polymers that have regular polymer backbone structures, such as (—$CF_2$—$C_6H_4$—$CF_2$)$_N$— or (—$CF_2$—$C_6F_4$—$CF_2$)$_N$—, etc, the current invention will provide other random copolymers consisting of irregular polymer backbone structures. Without having a regular repeating unit in their backbone structures, these linear random copolymers cannot crystallize; thus they will be totally amorphous. Also note that these copolymers are not available using Gorham method or using a dimer.

Additional methods based on the similar chemistry described above also can be used to prepare amorphous low ∈ films useful for fabrications of future ICs. These amorphous copolymers consist of 3 dimensional networks or cross-linking structures. They can be prepared using co-monomers or cross-linkers that have a general chemical structure of precursor (X):

$$(X)_m—Ar—(CF_2Y)_n \quad (X)$$

Here, Y is as defined above. Individually, each of n and m is an integer and can be zero, but (n+m) should be ≧3 yet should not be greater than the maximum number of sites for $sp^2C$ substitution in the aromatic moiety, Ar. Ar is an aromatic moiety including, but not limiting to, the phenyl moiety, —$C_6H_{4-n}F_n$(n=0 to 4) such as —$C_6H_4$— and —$C_6F_4$—; the naphthenyl moiety, —$C_{10}H_{6-n}F_n$— (n=0 to 6) such as —$C_{10}H_6$— and —$C_{10}F_6$—; the di-phenyl moiety, —$C_{12}H_{8-n}F_n$— (n=0 to 8) such as $C_6H_2F_2$—$C_6H_2F_2$— and —$C_6F4C_6H$—; the anthracenyl moiety, —$C_{12}H_{8-n}F_n$— (n=0-8); the phenanthrenyl moiety, —$C_{14}H_{8-n}F_n$— (n=0-8); the pyrenyl moiety, —$C_{16}H_{8-n}F_n$— (n=0-8), and more complex combinations of the phenyl and naphthenyl moieties, —$C_{16}H_{10-n}F_n$— (n=0-10). Isomers of various fluorine substitutions on the aromatic moieties are also included in this invention.

All amorphous polymer films consisting of random polymer chain orientations will result in equal interfacial stress in all directions, thus avoiding problems that are associated with semi-crystalline polymers. These amorphous low ∈ films can be very useful for fabrication of future ICs that use Cu Dual Damascene process for the reasons given below.

Most PPX films that consist of regular chemical structure or repeating unit in their backbone structures, such as PPX-N and PPX-F, are semicrystalline. Depending on the morphologies and polymer chain orientations, their in-plane (xy-plane) and out-of-plane (z-plane) stresses in films can be very different. Presence of anisotropic stresses at dielectric/metal interfaces can induce serious stress concentration on thin barrier metal inside a Cu Dual Damascene configuration and make ICs unreliable, if it is not handled correctly.

In addition, when a semicrystalline film was deposited at a low temperature, and/or not using proper processing conditions, the resulting thin film would have low crystallinity and undesirable polymer chain orientations. For instances, due to unstable PPX/metal interfaces, ICs fabricated using Cu Dual Damascene process would fail when ICs exposed to high temperatures in subsequent processes such as wire bonding. This dimensional instability a result of recrystllization or polymer chain reorganization at high temperatures. Therefore, when a semicrystalline polymer was used as a dielectric, special processing conditions had to be used in order to make it useful for making reliable ICs. In principle, it is important to know the temperature range at which recrystalization or polymer chain reorganization will occur. Detailed descriptions for proper processing of semi-crystalline polymer films in Cu Dual Damascene configuration will follow.

Processing Methods for Integration of Low ∈ Films:

X-Ray Photo Spectroscopy ("XPS") results of PPX-F films prepared from dimer (Plano et al., *MRS Symp. Proc.*, Vol. 476 (1998), pp. 213–218) showed undetectable changes in its chemical composition after annealing at 425 to 450° C. for two hours in vacuum. The Bending Beam technique, Ho et al. (*MRS Spring Meeting Proceeding*, Section, 06.9, 1999) also showed that PPX-F was dimensionally stable up to the same temperature range after first thermal cycle. It is known that PPX-F films adsorb less than 0.02-0.04% moisture at ambient. However, none of the previous studies taught processes or methods to make PPX-F films passing the Ta compatibility test. In fact, there is no existing published document or patent demonstrating processes and methods for making any Ta-compatible dielectric having ∈≦2.5.

Test structures appearing in FIGS. 1 & 2 give illustrations of proper processing methods of this invention. FIG. 1 shows a commonly used Ta test structure, 1, consisting of Ta, 2, low ∈ film of dielectric, 3, and silicon dioxide, 4, on a silicon wafer, 5. This structure is referred to as Ta test structure.

Figure 2A:
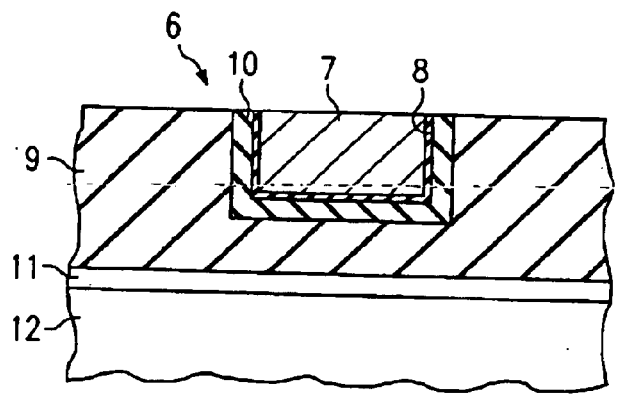
FIG. 2a shows a Simple Damascene Test Structure.

FIGS. 2*a* & *b* show test structures consisting of Cu/Ta/low ∈ films on Si wafer. Respectively, these will be referred as a Simple Damascene (FIG. 2*a*) and a Dual Damascene (FIG. 2*b*) test structures. The Simple Damascene test structure, 6, of FIG. 2*a* consists of a conductor, 7, a barrier metal, 8, a second dielectric, 9, and a first dielectric, 10, a silicon dioxide, 11, on a silicon wafer, 12. The Dual Damascene test structure, 14, of FIG. 2*b* consists of a conductor, 15, a first dielectric, 19, a second dielectric, 16, a metal barrier, 17, an etch stop, 18, a silicon dioxide, 20, on a silicon wafer, 21.

How the bilayer (Ta/low ∈ film) structure shown in FIG. 1 is processed affects whether the integrity of Ta can be intact during the subsequent annealing at 300 to 350° C. In principle, any metal and polymer contact can be subjected to interfacial diffusion of metal into the polymer if metal ions become mobile at high temperatures. Therefore, a good barrier layer is required. For certain polymer-metal interfaces, such as the Chromium-Polyamide acids interface, metal diffusion was enhanced due to the presence of water that was generated from "imidization" of the polyamide acids. For hydrocarbon polymers such as PPX-N and PPX-F, in the absence of soluble water in these PPX, metal diffusion can be avoided if a good barrier metal is used. For example, 200 Å of Ta barrier layer can prevent Cu diffusion into a dielectric layer at a temperature of up to about 550° C.

In the future, ICs that use electrically plated copper as conductor, the required annealing temperature for copper ranges from 300° C. for one hour to 350° C. for 30 minutes. In principle, any PPX that has a glass transition temperature ("Tg") of lower than 350° C. would not be suitable for manufacturing of these ICs. For instance, after annealing of PPX-N over Ta on Si at 300° C. for 30 minutes, Ta was found inside PPX-N according to Rutherford Backscattering Spectroscopy ("RBS") analyses. It is largely because PPX-N has a Tg (about 68° C.) which is much lower than the annealing temperatures, and these films were not processed properly.

The Tg of PPX-F is only about 170° C. according to measurements using a Differential Scanning Calorimeter ("DSC"). Therefore, after annealing the Ta/PPX-F at 350° C. for 30 minutes in vacuum, diffusion of Ta into PPX-F would also be expected. However, Ho et al. (*MRS Spring Meeting Proceeding*, Section, 06.9, 1999) found that both Tg and crystallinity of the annealed PPX-F have increased significantly. Therefore, one of the processes of one aspect of this invention comprises post annealing of "as-deposited PPX-F" under proper conditions. For instance, by heating the as-deposited PPX-F under inert conditions at temperature ranges from 230 to 425° C. for 10 to 30 minutes. Despite the fact that the resulting PPX-F still has a Tg of only slightly higher than 170° C., the annealed PPX-F might devoid from Ta diffusion. It is expected that PPX-F should have crystallinity of at least 50 to 60% or higher to be effective to stop the diffusion of Ta into the semicrystalline PPX-F layer during later annealing of copper at 350° C.

However, it is also expected that having high crystallinity is a necessary but not a sufficient condition to stop Ta's diffusion into PPX-F. For this reason, not all pre-annealed PPX-F films would pass the Ta compatibility test. This is due to the fact that even a highly crystalline material, such as an over 60% crystalline PPX-F film, still consists of large portion of amorphous regions. According to Wunderlich and his associates (Wunderlich et al., *J. Polym. Sci. Polym. Phys. Ed.*, Vol. 11, (1973), pp. 2403–2411; *ibid, J. Polym. Sci. Polym. Phys. Ed.*, Vol. 13, (1975), pp. 1925–1938), most semicrystalline polymers consist of crystals that are end-capped with folded polymer chains. Therefore, polymer films with the same amounts of crystallinity may still have very different morphologies or polymer chain orientations on film surfaces. If a high crystalline film has most of its polymer chains aligned parallel to the xy-plane of the film or polymer/metal interfaces, metal diffusion may be avoided when a polymer's melting temperature ("$T_m$") is higher than the annealing temperature. On the contrary, if polymer/metal interfaces consist mostly of folded-chains or amorphous polymers, metal would still diffuse into these amorphous regions, even if they have sufficiently high crystallinity and melting temperatures. This is because the Tg of these amorphous regions is only a fraction of the $T_m$ (Tg=0.56 to 0.85 $T_m$).

In short, it is imperative that one has to make not only highly crystalline dielectric film but also proper polymer chain orientations on the PPX-F surfaces. Following are some of the processing methods that are required for controlling polymer chain orientation in semicrystalline PPX films:

1. In order to induce heterogeneous nucleation of polymer nuclei during film deposition, the substrate surface undergoes pre-treatment. The pre-treatment may include chemical reactions to generate free radicals on the substrate surface, so that intermediate diradicals for film growth would directly react and then grow into extended-chain nuclei. Further film growth would result in a thin film that would have most of it polymer chains perpendicular to its xy-plane. Polymer films prepared from extended-chain nuclei (Wunderlich, *Macromolecular Physics*, Vol. 1 (1973), Academic Press, Chapter 3) could have very high (>70–80%) crystallinity that would result in impermeable PPX-F films for Ta diffusion. Other pre-treatment methods include irradiation of the substrate surface with photons, for instance with UV or X-ray.

Post chemical treatment of polymer thin film surfaces could also induce polymer chain orientations on it surface. The treatment would result in film surfaces that have desirable polymer chain orientations and higher crystallinity. Aromatic compounds, such as xylenes, naphthalenes, halogen-containing solvents, such as chloroform, and aromatic compounds consisting of halogens, such as chlorobenzenes are useful solvents for this invention. Other commonly used solvents that are familiar to those skilled in the art such as methyl ethyl ketone ("MEK") and acetone could also being used. These solvents are capable of inducing surface re-crystallization of PPX and other polymers.

PPX-N has at least two distinctively different crystalline forms, a high ($\beta$) and low ($\alpha$) temperature forms. By heating the $\alpha$ form through its crystal transformation temperature, $T_t$, at about 200 to 220° C., the $\beta$ form crystal will be obtained. The crystal transformation can result in dimensional changes and films with higher crystallinity and different polymer chain orientations. Ho et al. (*MRS Spring Meeting Proceeding*, Section, 06.9, 1999) have reported similar crystal transformation for PPX-F. However, there is no publication or patent that teach methods to obtain high temperature PPX-F crystalline films directly from deposition. In addition, all PPX-F film prepared so far failed the Ta-compatibility test.

When $T>T_t$, crystal transformation of PPX-F would induce either compression or tensile stress that would result in dimensional instability and failure of the thin Ta ($\approx$200 Å) that covers over the PPX-F. If polymer chains became more parallel to xy-plane of the dielectric at $T>T_t$, expansion of dielectric would result in tensile stress for Ta thin film. If most of the polymer chains already aligned parallel to its xy-plane, densification of the dielectric would result in compression stress on Ta thin film. In either case, Ta might fail because it is too thin (<250 Å) to bear the stress.

Therefore, it is imperative that one has to prepare PPX-F films consisting of not only high crystallinity but also mostly high temperature crystal form. This can be achieved by controlling deposition conditions, especially by optimizing feed rate and substrate temperature. Therefore, one aspect of this invention is to prepare PPX-F films consisting of mostly its high temperature crystal form and also with high crystallinity. When a PPX-F consisting of highly crystalline and mainly high temperature form, integrity of the Ta/PPX-F test structure then can be assured during annealing at 300 to 350° C.

Accordingly, the PPX-F films useful for this invention are prepared by controlling the feed rate for precursors and substrate temperature under a certain range of vacuum pressure in deposition chamber. The suitable vacuum range is around a few mTorrs, for instance, from about 1 to about 100 mTorrs, preferably from about 5 to about 25 mTorrs. Under this vacuum range, the crystal form and crystallinity are results of feed rate and substrate temperature. Suitable substrate temperature for this invention can range from about −10 to about −80° C., preferably from about −25 to about −45° C. Substrate temperature is controlled by cooling of an electric chuck or wafer holder using a coolant. Substrate temperature below about −45° C. is desirable for obtaining high deposition rate, but it requires a special coolant such as expensive fluorocarbon fluid or silicone oil. In addition, it should be noted that at very low substrate temperatures (<−50 to −60° C.), nucleation rates can be very high and hetero-epitaxial or highly oriented crystal growth is possible. The polymer crystals thus would result in "transcrystalline" or "columnar" forms that can prevent Ta corrosion at interfaces. At these low temperature ranges, diradicals are absorbed very rapidly and so the film growth rates are very high. However, this is achieved at the expense of resulting crystallinity due to entrapment of low molecular weight PPX-F or defects. Despite favorable polymer chain orientations at interfaces, low crystallinity can result in high Ta diffusion rate in the PPX-F. PPX-F films prepared under these conditions thus still need to be properly annealed before they can be used for integration or contact with Ta.

Therefore, under the desirable vacuum ranges of a few mTorrs and at desirable substrate temperatures ranging from about −25 to about −45° C., desirable high temperature crystals with large amounts of crystallinity can be obtained by adjusting the feed rate of precursors. Depending on the chemistries (as discussed above) and precursors employed for the preparation, the feed rates can be very different. For instance, under about 10 to about 15 mTorrs of chamber pressure and at the substrate temperature of from about −30 to about −45° C., highly crystalline, high temperature crystal forms can be obtained at a feed rate of about 0.35 mmoles /minute, or about 21 mmoles/hour of dimer, $(CX_2—C_6H_{4-n}Z_nCX_2—)_2$ (Z=X=H, n=0). Under similar conditions of substrate temperature and vacuum range, however, it would need about 1.8 to 3.4 mmole/hour of monomer, (Br—$CF_2$—$C_6H_4CF_2$—Br) for preparations of highly crystalline and high temperature form of PPX-F film. In summary, following the teachings described in this invention, preparative conditions that are useful for preparing highly crystalline and high temperature PPX-F crystals can be easily optimized by those skilled in the field of this art.

On the another hand, when the substrate temperature is higher than from about 10 to about 20° C., nucleation is hardly possible due to low adsorption of reactive intermediates. However, under very high feed or flow rates, polymer crystal growth can still be possible after an induction period to overcome primary nucleation on substrate. PPX-F crystals prepared under these conditions could result in columnar morphology with favorable polymer chain orientations and also had highly crystallinity. Even without annealing, these as deposited PPX-F films could be useful for integration into future ICs that use copper as conductor and Ta as barrier metal. Also, it is possible to prepare high temperature crystal form of PPX-F at substrate temperatures above 40–60° C., though the deposition rate will suffer enormously.

Figure 2B:
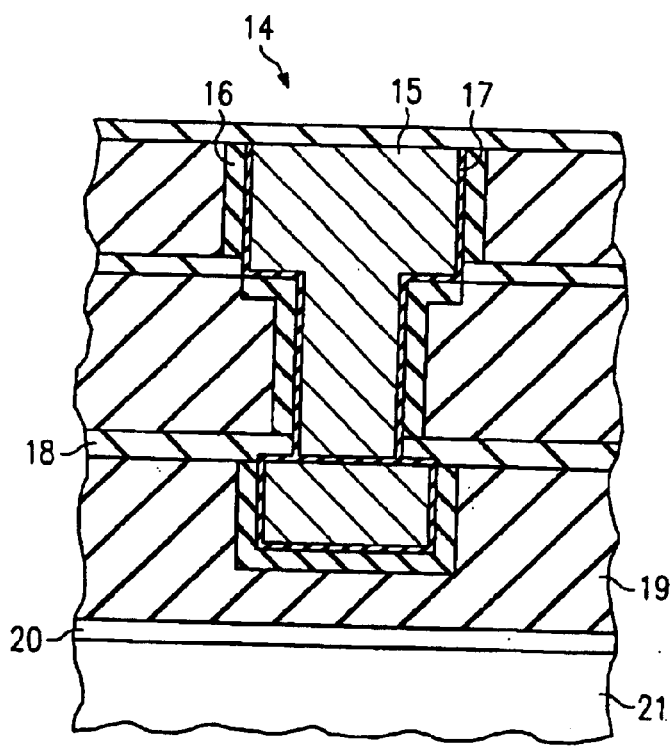
FIG. 2b shows a Dual Damascene Test Structure.

Furthermore, it should be pointed out that for PPX-F films that passed Ta compatibility test using Ta test structure (FIG. 1), depending on test procedures, they might still fail inside a Cu Dual Damascene test structure (FIG. 2*b*). Therefore, novel processes and methods are disclosed for preparing stable Cu Dual Damascene test structures. In essence, applications of the methods will ensure the integrity of future ICs that are prepared using Cu Dual Damascene process.

FIG. 2*a* shows an already completed simple Damascene structure that is ready for deposition of another layer of low $\in$ film. Note that at the two middle corners of the simple damascene structure, the vertical Ta wall was subjected to a larger Z-plane expansion in the low $\in$ film due to preferred polymer chain orientations in the xy-plane. However, since Ta was sandwiched between the patterned low $\in$ film and Cu, integrity of Ta might be intact pending on the actual aspect ratio or configuration of the test structure. This would not be the case if annealing was conducted before the Ta layer was covered with Cu. If the annealing test was conducted at this stage, Ta might still crack even it was processed according the methods discussed above. In this case, before PVD deposition of Ta, it would be desirable to deposit a thin ($\approx$100 to 300 Å, shown as the first dielectric 9 in FIG. 2*a*) layer of isotropic or amorphous low $\in$ film over already patterned semicrystalline low $\in$ film. Therefore, the resulting Cu Damascene structure would consist of a heterogeneous dielectric layer ("HDL"). The amorphous thin film can be deposited very conformably over the underlying semicrystalline film in the test structure. The presence of this amorphous polymer layer would provide isotropic stress on Ta and reduce the risk of stress concentration or failure of the Ta thin film. Amorphous low $\in$ polymers that have high Tg and thermal stability are in particular very useful for practicing this invention. In addition to what has already being discussed in this application, other amorphous low $\in$ polymers that have high Tg and thermal stability will also be useful for this invention.

In FIG. 2b, a Dual Damascene test structure was built on the top of a simple Damascene. The dielectric layer can not be deposited as described in the above simple Damascene test structure (FIG. 2b), because the conformal coating of a first dielectric, 19, would also cover the bottom of the via, an interconnecting hole. In this case, a thin dielectric layer, 16, with amorphous structure can be obtained by surface treatment with solvents mentioned above and by flashy evaporation of the solvent. When polymer chains on the exposed surface areas are exposed and partially swelled by a solvent, the polymer chains become randomized in orientation. Quickly removing the solvent under vacuum and low temperature would freeze these polymer chains in random state. On the other hand, irradiation of exposed polymer chains in the Damascene with plasma or UV can also cause formation of amorphous surface or recrystallization. Surface recrystallization would result in preferred chain orientations that are parallel to the exposed surface, thus result in a lower CTE-mismatch with Ta and Cu at the vertical wall of the Dual Damascene structure.

Deposition Systems for Low ∈ Film Depositions

Figure 3:
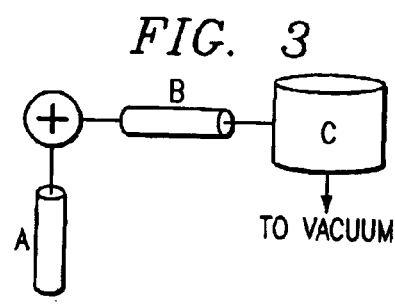
FIG. 3 shows a deposition system for transport polymerization.

To practice this invention effectively, not only special processing conditions but also special deposition systems are required. Briefly:

The deposition system would consist of at least three main components as shown in FIG. 3. Part A, the sample holder, is a material delivery system that is connected to Part B, a reactor, that is connected to Part C, a deposition chamber, which is connected to a vacuum. According to the transport polymerization processes described in a review (Lee, J. Macromol. Sci-Rev. Macromol. Chem., C16 (1), 79–127 (1977–78), pp. 79–127), precursor contained in Part A is heated under vacuum to provide sufficient vapor precursor molecules. The vapor precursors then will be transported through the reactor, Part B, to generate reactive intermediates. The intermediates will be further transported to the deposition chamber, Part C, and polymerize on the surface of a cold wafer or substrate inside Part C.

In most cases, when the precursors useful for this invention are liquid with low boiling point or high vapor pressure at low sample temperatures, these precursors are relatively inert to the construction material of the sample holder. However, it is a common practice to use quartz or Pyrex glass container for the precursors. By controlling the sample temperature and using a needle valve between Parts A and B, feed rate of a precursor under vacuum can be controlled. In a production system, the liquid can be delivered quantitatively using a pre-calibrated, commercial liquid delivery system. Alternatively, the liquid precursor can be heated to generate sufficient amounts of vapor, then a gas flow controller (GFC) is used to control the amounts of vapor precursor. The GFC is in fluid connection with the reactor. When a precursor is solid, quantitative delivery of vapor precursor requires more elaborate and more expensive commercial equipment. This type of equipment has been commonly used in the Chemical Vapor Deposition using Metal Organic Compounds ("MOCVD") processes and has been around for many years. However, well developed processing conditions and calibrations are needed to extend pot life of each solid precursor that is constantly kept under heating.

To prevent condensation and convection flow of precursor vapors, the path in between Parts A and B should only be heated slightly higher than Part A. For instance, when sample temperature is 60° C., the path should be maintained at temperatures ranging from about 70 to 80° C. The chemistry that can be used in reactor, Part B, varies depending on the molecular designs of precursors. Various basic chemistries that can be useful for generating reactive intermediates have been reviewed (Lee, J. Macromol. Sci-Rev. Macromol. Chem., C16 (1), 79–127 (1977–78), pp. 79–127). In the present invention, reactive intermediates are radical in nature and they can be generated in vacuum by thermal cracking.

Accordingly, depending on the Bond Dissociation Energy ("BE") of the chemical bond between a leaving group and an intermediate group, the required reactor temperatures varies. From studying the relationships between decomposition temperatures of various polymers and the BE of corresponding chemical bonds involved and also the cracking temperatures of various monomers and dimers used in transport polymerization, a general equation has been derived to estimate the minimum required reactor temperature ("Tr") for precursors:

$$Tr = K_1 + K_2 * (BE) \qquad (7)$$

wherein Tr is the minimum reactor temperature in ° C. BE is in Kcal/mole. $K_1$ and $K_2$ are constants depending on the dimension and the degree of vacuum of a reactor, and they are respectively in ° C. and in ° C.-mole/Kcal. For instance, when the reactor is under 10 mTorrs vacuum, $K_1$=320 and $K_2$=6.2. Therefore, for the precursor (IV, Y=Br), the minimum required reactor temperature is about 680° C. for a tubular reactor of about 8 inches long and 1.2 inches in diameter.

The path between Parts B and C also must be kept at a temperature of from about 20 to 40° C. higher than the ceiling temperature ("$T_c$") of the intermediates. The $T_c$ is the minimum temperature below which the intermediates can condense and thus polymerize on a solid substrate. For instance, the $T_c$ for diradical (II, X=Z=H, n=4) is from about 10 to about 15° C. A diffuser on the lid of the chamber and on the chamber wall should also be kept at temperatures of from about 20 to about 30° C. higher than $T_c$. Since the distance between the diffuser and the wafer on cold chuck is very small (a few millimeters), it is desirable not to overheat the diffuser, so the intermediates will come out of the diffuser at a temperature as low as possible. Hot intermediates tend to bounce off the cold wafer, and thus might not be adsorbed and polymerized on wafer.

An E-chuck (or Electrical Static Chuck, "ESC") is used to control the wafer temperature. The ESC is cooled via its contact with a base plate that is cooled by coolant or by a thermoelectric device. The ESC is also designed to provide very close contact with the wafer. To improve heat transfer, He is used to fill gaps between the wafer and ESC. The minimum He required for this purpose ranges from 1 to 10, preferably 2–5 Torrs De-chuck is normally achieved by first turning off the power supply to the ESC, then by lifting the wafer using three pins beneath the wafer.

The following examples are set forth to illustrate the present invention and should not be construed to limit its scope.

EXAMPLE 1

Transport Polymerization of (Br—$CF_2$—$C_6H_4$—$CF_2$—Br)

Deposition of PPX-F is performed using a deposition system consisting of a quartz reactor that is heated by an IR heater to provide a temperature of about 580° C. The quartz reactor has a volume of 40 cm³ and a porous quartz insert to provide an internal surface area of about 300 cm². The precursor is heated in a sample holder at 65° C. and is transported to the reactor via a needle valve under a system vacuum of about 12 mTorrs. The reacted precursors or reactive intermediates are transported to a 200 mm wafer that is kept at −35° C. using an E-chuck. The resulting film is annealed at about 400° C. for 30 minutes under nitrogen atmosphere. The peak ratio of (900 cm-1/1100 cm-1) for a peeled film is 0.95.

EXAMPLE 2
Transport Polymerization of (Br—$CF_2$—$C_6H_4$—$CF_2$—Br)

Deposition of PPX-F is performed using a deposition system consisting of a quartz reactor that is heated by an IR heater to provide a temperature of about 580° C. The quartz reactor has a volume of 40 $cm^3$ and a porous quartz insert to provide an internal surface area of about 300 $cm^2$. The precursor is heated in a sample holder at 65° C. and is transported to the reactor via a needle valve, under a system vacuum of about 12 mTorrs. The reacted precursors or reactive intermediates are transported to a 200 mm wafer that is kept at −38.5° C. using an E-chuck. The resulting film is annealed at about 400° C. for 30 minutes under nitrogen atmosphere. The heat of melting for a free standing film is 19.2 J/g, as measured by Differential Scanning Thermal Analyzer ("DSC").

EXAMPLE 3
Transport Polymerization of (Br—$CF_2$—$C_6H_4$—$CF_2$—Br)

Deposition of PPX-F is performed using a deposition system consisting of a quartz reactor that is heated by an IR heater to provide a temperature of about 580° C. The quartz reactor has a volume of 40 $cm^3$ and a porous quartz insert to provide an internal surface area of about 300 $cm^2$. The precursor is heated in a sample holder at 65° C. and is transported to the reactor via a needle valve under a system vacuum of about 12 mTorrs. The reacted precursors or reactive intermediates are transported to a 200 mm wafer that is kept at −40° C. using an E-chuck. The resulting film is annealed at about 400° C. for 30 minutes under nitrogen atmosphere. The Debye-Scherrer pattern from X-ray diffraction of the film shows a major diffraction peak, 2 theta at 20.5 degrees.

EXAMPLE 4
Transport Polymerization of (Br—$CF_2$—$C_6H_4$—$CF_2$—Br)

Deposition of PPX-F is performed using a deposition system consisting of a quartz reactor that is heated by an IR heater to provide a temperature of about 580° C. The quartz reactor has a volume of 40 $cm^3$ and porous quartz insert to provide an internal surface area of about 300 $cm^2$. The precursor is heated in a sample holder at 65° C. and is transported to the reactor via a needle valve under a system vacuum of about 12 mTorrs. The reacted precursors or reactive intermediates are transported to a 200 mm wafer that is kept at −40° C. using an E-chuck. The resulting film is annealed at about 400° C. for 30 minutes under nitrogen atmosphere. A 200 Å of Ta is deposited over the film and the sample is heated to 350° C. for 30 minutes under vacuum. The resulting sample shows no breakage of Ta or underlying dielectric film. Results from Rutherford Back Scattering ("RBS") analysis show no Ta diffused into PPX-F, nor organic mater inside Ta.

EXAMPLE 5
Transport Polymerization of (Br—$CF_2$—$C_6H_4$—I and ($CF3$—CF (—O—)—$CF2$))

Deposition of PPX-F is performed using a deposition system consisting of a quartz reactor that is heated by an IR heater to provide a temperature of about 580° C. The quartz reactor has a volume of 40 $cm^3$ and porous quartz insert to provide an internal surface area of about 300 $cm^2$. The molar ratio is equal to one. The reacted precursors or reactive intermediates are transported to a 200 mm wafer that is kept at −35° C. using an E-chuck. The XPS of the resulting film is similar to that PPX-F. The film thickness reduces about 1.0 to 1.6% after annealed at about 400° C. for one hour under nitrogen atmosphere.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications, and variations as falling within the true scope and spirit of the present invention.

I claim:

1. A polymer film prepared from a method comprising:
co-polymerizing an intermediate (A) and an intermediate (B);
wherein,
intermediate (A) and intermediate (B) are co-polymerized at a feed rate onto a substrate having a substrate temperature under vacuum or inert atmosphere with a slow system leakage rate, the substrate temperature being below a melting temperature of the intermediate (A);
the intermediate (A) is an aromatic compound consisting of n' reactive sites with n' unpaired electrons and n' is an integer of at least 2 but is smaller than, or equal to, the maximum number of sites for the $sp^2C$ substitution in the intermediate (A)
the intermediate (B) is a bridging compound consisting of n" reactive sites with n" unpaired electrons; and n" is an integer of at least 2 but is smaller than, or equal to, the maximum number of sites for the $sp^3C$ substitution in the intermediate (B); and
the polymer film has a thermal stable crystalline form suitable for use as a dielectric thin film in fabrication of an integrated circuit.

2. The polymer film of claim 1, wherein the vacuum is lower than about 30 mTorrs and the system leakage rate is less than about 2 mTorrs per minute.

3. The polymer film of claim 1, wherein the inert atmosphere is an atmosphere that is devoid from either a free radical scavenger or a compound containing an active hydrogen.

4. The polymer film of claim 3, wherein the free radical scavenger comprises water and oxygen.

5. The polymer film of claim 3, wherein the active hydrogen comprises a compound containing an —OH, an —SH, or an —RNH group.

6. The polymer film of claim 1, wherein the intermediate (A) is a benzyne.

7. The polymer film of claim 1, wherein the intermediate (A) is a fully-fluorinated benzyne or a partially-fluorinated benzyne.

8. The polymer film of claim 1, wherein the intermediate (B) has a general chemical structure of .C.(Z'Z"), in which each of Z' and Z" is independently H, F, or —$C_6F_5$.

9. The polymer film of claim 1, wherein the intermediate (B) is a divalent carbon.

10. The polymer film of claim 1, wherein the intermediate (B) is a carbene.

11. The polymer film of claim 1, wherein the intermediate (B) is a fully-fluorinated carbene or a partially-fluorinated carbene.

12. A fluorinated polymer film prepared from a method comprising:
co-polymerizing at least two reactive intermediates;
wherein,
the reactive intermediates are co-polymerized at a feed rate onto a substrate having a substrate temperature under vacuum or inert atmosphere with a slow system leakage rate; and the fluorinated polymer film has a thermal stable crystalline form suitable for use as a dielectric thin film in fabrication of an integrated circuit, and the fluorinated polymer film comprises fully fluorinated or partially fluorinated polymers.

13. The fluorinated polymer film of claim 12 wherein the fluorinated polymers are polymers or copolymers of $-CF_2C_6H_4CF_2-$, $-CF_2C_6F_4CF_2-$, $-C_6H_4CF_2-$, or $-C_6F_4CF_2-$.

14. The fluorinated polymer film of claim 12 wherein the fluorinated polymer film is a heterogeneous film comprising of semicrystalline polymers.

15. The fluorinated polymer film of claim 12 wherein the fluorinated polymer film is a homogeneous film.

16. The fluorinated polymer film of claim 12 wherein the fluorinated polymer film is suitable for fabrication of optical devices.

* * * * *